United States Patent
Huang et al.

(10) Patent No.: US 8,703,519 B1
(45) Date of Patent: Apr. 22, 2014

(54) STRUCTURE AND MANUFACTURING METHOD FOR HIGH RESOLUTION CAMERA MODULE

(71) Applicant: Kingpak Technology Inc., Hsin-Chu Hsien (TW)

(72) Inventors: Chun-Lung Huang, Hsin-Chu Hsien (TW); Hsiu-Wen Tu, Hsin-Chu Hsien (TW); Cheng-Chang Wu, Hsin-Chu Hsien (TW); Chung-Yu Yang, Hsin-Chu Hsien (TW); Rong-Chang Wang, Hsin-Chu Hsien (TW); Jo-Wei Yang, Hsin-Chu Hsien (TW)

(73) Assignee: Kingpak Technology Inc., Hsin-Chu Hsien (TW)

( * ) Notice: Subject to any disclaimer, the term of this patent is extended or adjusted under 35 U.S.C. 154(b) by 0 days.

(21) Appl. No.: 13/796,622

(22) Filed: Mar. 12, 2013

Related U.S. Application Data

(60) Provisional application No. 61/711,594, filed on Oct. 9, 2012.

(51) Int. Cl.
*H01L 21/00* (2006.01)
(52) U.S. Cl.
USPC .................................. 438/64; 257/E21.001

(58) Field of Classification Search
None
See application file for complete search history.

(56) References Cited

U.S. PATENT DOCUMENTS

2012/0071710 A1* 3/2012 Gazdzinski .................. 600/101

* cited by examiner

*Primary Examiner* — Seahvosh Nikmanesh
(74) *Attorney, Agent, or Firm* — Morris, Manning & Martin, LLP; Juan Carlos A. Marquez

(57) ABSTRACT

The present invention discloses a structure and a manufacturing method for a high-resolution camera module, wherein the method includes the following steps: providing an image sensor wafer comprising multiple image sensor chips; performing inspection and defining if each image sensor chip is a good chip; disposing an optical cover on the image sensor chip defined as the good chip, wherein the optical cover faces a sensing area and does not cover conductive contacts; cutting the image sensor wafer to obtain the discrete image sensor chip covered with the optical cover; and disposing a first surface of the divided image sensor chip on a bottom surface of a ceramic substrate. The present invention can seal the high resolution camera module during early stage of the manufacturing process to improve the yield rate of the camera module, and downsize the camera module effectively.

10 Claims, 16 Drawing Sheets

STRUCTURE AND MANUFACTURING METHOD FOR HIGH RESOLUTION CAMERA MODULE

BACKGROUND OF THE INVENTION

1. Technical Field

The present invention relates to a structure and a manufacturing method for a camera module. More particularly, the present invention relates to a structure and a manufacturing method for a high resolution camera module.

2. Description of Related Art

The portability of mobile phones has brought increased efficiency and convenience to our daily lives. At the same time, continuous improvement in technology has provided mobile phones with more and more functions, including picture taking and video recording for example. In order to meet the requirement for using a high-resolution camera module having advantages of being light, compact, and suitable for mass-production in a mobile phone, the manufacturing process of such camera modules must be effectively simplified, and the module structure must be downsized.

FIG. 1 shows the structure of a conventional high-resolution camera module in cross-section, and FIG. 2 is the flowchart of a conventional method for making a high-resolution camera module. Referring to FIG. 1, a conventional high-resolution camera module 10 includes: a ceramic substrate 11, a glass cover 12, an image sensor chip 13, a packaging portion 14, and a plurality of passive elements 15. As shown in FIG. 2, a method S100 for making a high-resolution camera module includes the steps of: providing a ceramic substrate attached with a glass cover (step S10), providing an image sensor chip onto the ceramic substrate by a flip-chip technique (step S20), and packaging the image sensor chip along its periphery (step S30).

The ceramic substrate 11 provided in step S10 is formed with a hollow portion and has a glass bonding surface 111 and a chip bonding surface 112. The glass bonding surface 111 and the chip bonding surface 112 are the top surface and the bottom surface of the ceramic substrate 11 respectively. The glass cover 12, which is bonded to the glass bonding surface 111, has an upper surface 121 and a lower surface 122. The periphery of the lower surface 122 is bonded to the glass bonding surface 111 such that the glass cover 12 covers the hollow portion of the ceramic substrate 11.

In step S20, the periphery of an upper surface of the image sensor chip 13 is connected to the chip bonding surface 112 by a flip-chip technique while a sensing area of the image sensor chip 13 is aligned with the hollow portion of the ceramic substrate 11, allowing external light to impinge on the sensing area through the glass cover 12. The image sensor chip 13 is electrically connected to the ceramic substrate 11 by conductive elements 16, e.g., solder balls. Thus, a cavity 17 is formed between the image sensor chip 13, the glass cover 12, and the ceramic substrate 11. The height of the cavity 17 is at least greater than the thickness of the ceramic substrate 11. The image sensor chip 13 may be a CMOS image sensor chip.

In step S30, the periphery of the image sensor chip 13 and the joint between the image sensor chip 13 and the ceramic substrate 11 are sealed with a mold compound by an underfill technique or an epoxy dispensing technique. Thus, the cavity 17 is sealed, and the packaging portion 14 is formed. A plurality of passive elements 15 may be additionally provided on the glass bonding surface 111 and be electrically connected to the ceramic substrate 11 by the conductive elements 16.

Nevertheless, the manufacturing method and structure described above have the following problems and limitations. First of all, as the surface of the image sensor chip 13 is not covered and protected by the glass cover 12 until a later stage of the manufacturing process, moisture or dust particles are likely to enter the image sensor chip 13 during manufacture, resulting in a high fraction defective and consequently a low yield rate. Further, the cavity 17 formed between the image sensor chip 13, the glass cover 12, and the ceramic substrate 11 is too large, which not only prevents the camera module from being effectively downsized, but also compromises the stability of temperature cycling tests.

SUMMARY OF THE INVENTION

The present invention discloses a structure and a manufacturing method for a high-resolution camera module, wherein the method comprises the following steps: providing an image sensor wafer; performing inspection; disposing an optical cover; cutting the image sensor wafer; disposing an image sensor chip on a ceramic substrate; and forming a packaging portion. The present invention improves yield rate of a high-resolution camera module by sealing the high-resolution camera module during early stage of the manufacturing process, and downsizes the high-resolution camera module.

The present invention provides a method for making a high-resolution camera module comprising the steps of: providing an image sensor wafer, wherein the image sensor wafer comprises a plurality of image sensor chips, each image sensor chip includes a first surface, a second surface, and a plurality of conductive contacts, wherein the first surface has a sensing area surrounded by the plurality of conductive contacts; performing an inspection to inspect and define if each image sensor chip is a good chip; disposing an optical cover on the first surface of the image sensor chip defined as the good chip, wherein the optical cover faces the sensing area and does not cover the conductive contacts, and the surface of the optical cover is smaller than the surface of the image sensor chip; cutting the image sensor wafer to obtain the discrete image sensor chip covered with the optical cover; disposing the image sensor chip on a ceramic substrate, wherein the ceramic substrate has a hollow portion, a bottom surface, and a top surface, a horizontal area of the hollow portion is larger than the surface of the optical cover, the first surface of the divided image sensor chip is adhered and disposed to the bottom surface and faces the hollow portion, and the conductive contacts of the image sensor chip is electrically connected to the ceramic substrate; and forming a packaging portion to cover a periphery of the image sensor chip and connection between the image sensor chip and the ceramic substrate.

The present invention also provides a structure of a high-resolution camera module, comprising: a ceramic substrate having a hollow portion, a top surface, and a bottom surface; a image sensor chip having a first surface and a plurality of conductive contacts, wherein the first surface has a sensing area surrounded by the plurality of conductive contacts, and the first surface is disposed on the bottom surface, such that the image sensor chip is electrically connected to the ceramic substrate through the conductive contacts; an optical cover disposed on the first surface by an adhesive, wherein the adhesive is in the region between the sensing area and the conductive contacts, and the optical cover is smaller than the image sensor chip and faces the sensing area; and a packaging portion covering a periphery of the image sensor chip and connection between the image sensor chip and the ceramic substrate.

At least the following improvements can be achieved with implementation of the present invention:

1. Improving yield rate of a high-resolution camera module by sealing the camera module during early stage of the manufacturing process; and 2. Downsizing the camera module effectively.

The detailed features and advantages of the present invention will be described in detail with reference to the preferred embodiment so as to enable persons skilled in the art to gain insight into the technical disclosure of the present invention, implement the present invention accordingly, and readily understand the objectives and advantages of the present invention by perusal of the contents disclosed in the specification, the claims, and the accompanying drawings.

DETAILED DESCRIPTION OF THE EMBODIMENTS OF THE INVENTION

Figure 1:
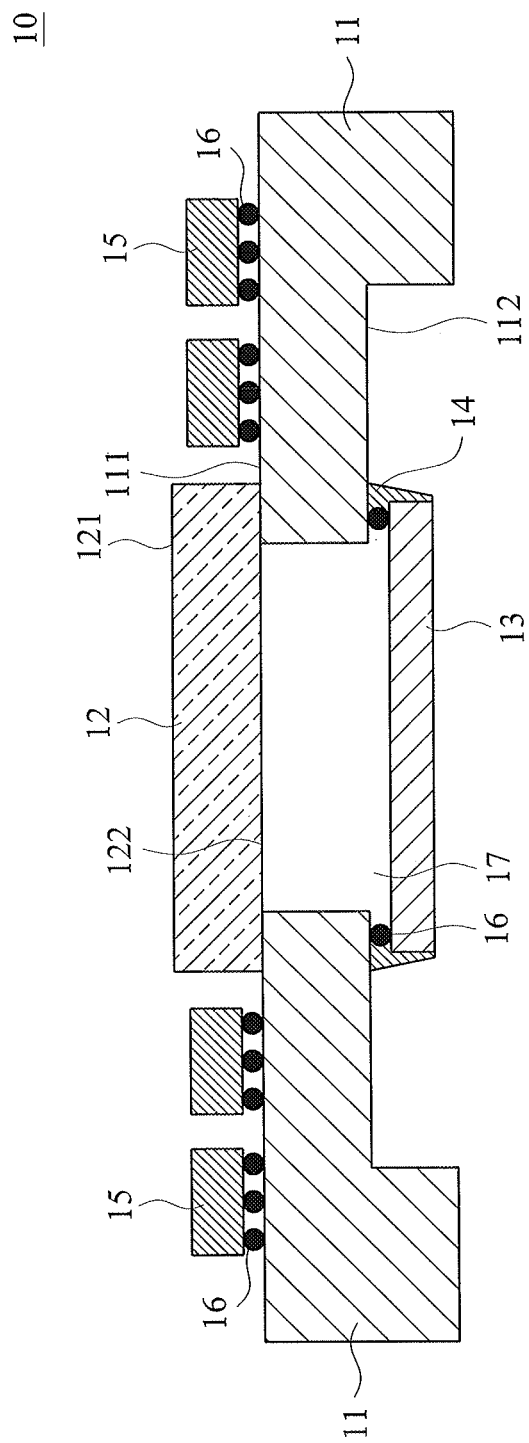
FIG. 1 is a sectional view for a structure of a conventional high-resolution camera module.
Figure 2:
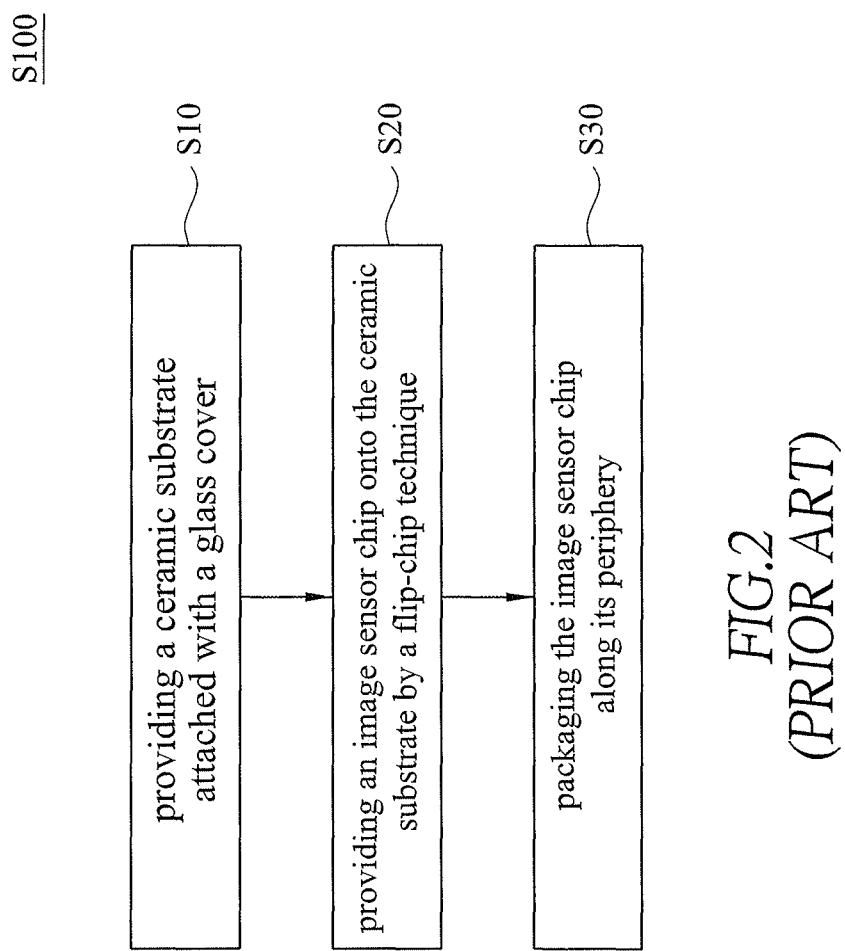
FIG. 2 is a flowchart of a conventional method for making a high-resolution camera module.
Figure 3:
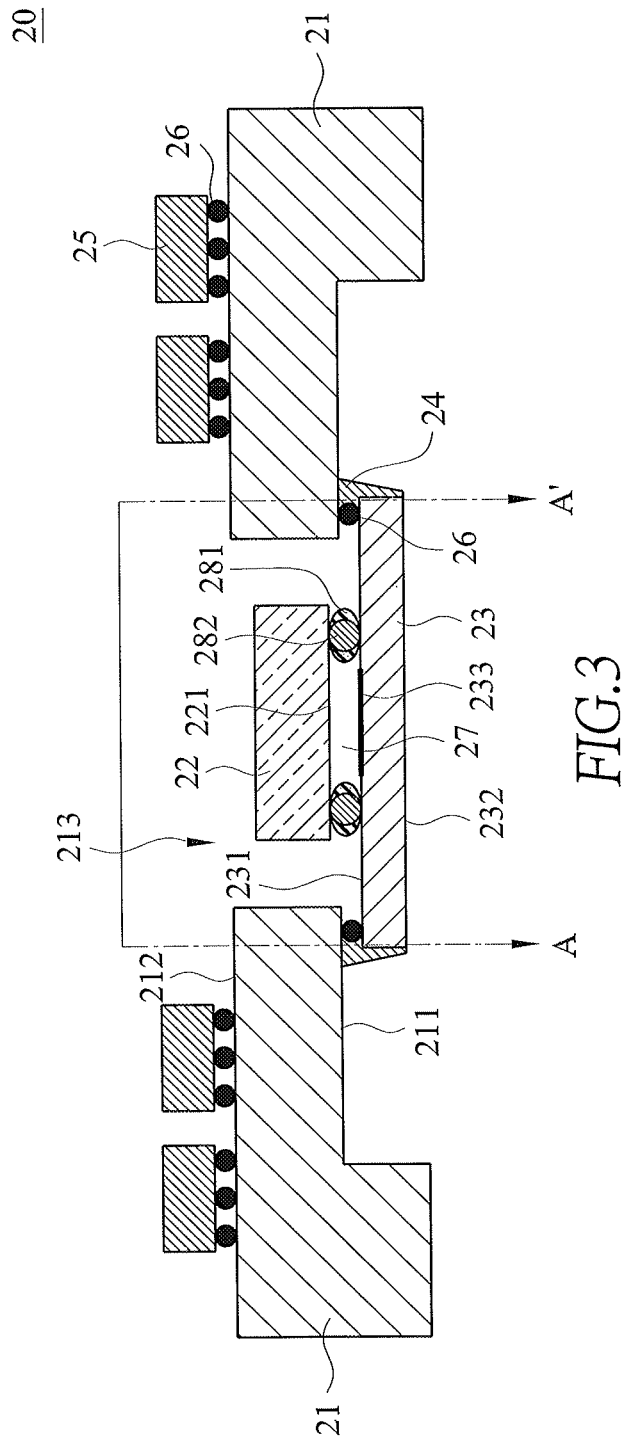
FIG. 3 is a sectional view for a structure of a high-resolution camera module according to an embodiment of the present invention.
Figure 4:
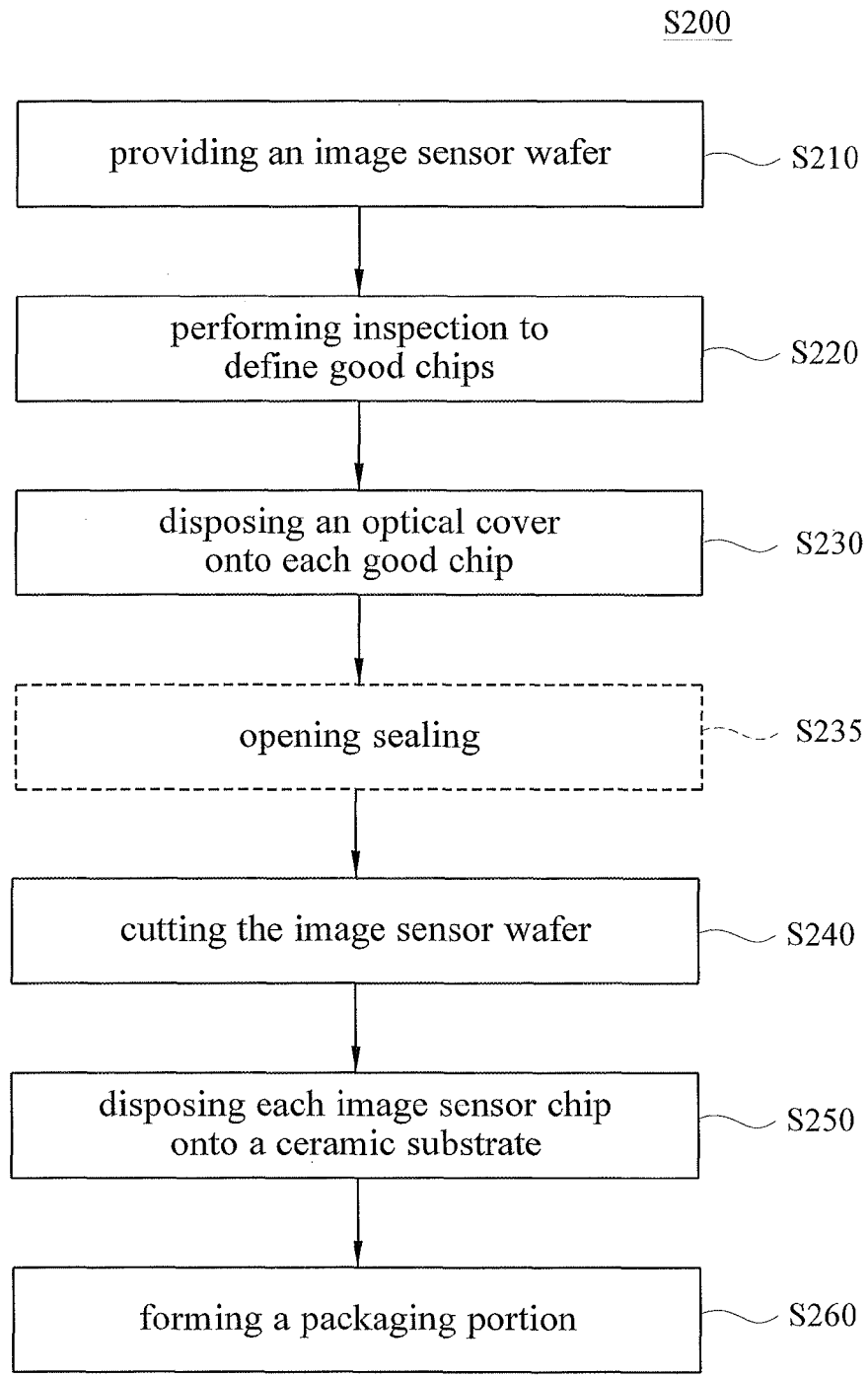
FIG. 4 is a flowchart of a method for making a high-resolution camera module according to an embodiment of the present invention.

Referring to FIG. 3, a high-resolution camera module 20 according to an embodiment of the present invention includes: a ceramic substrate 21, an optical cover 22, an image sensor chip 23, and a packaging portion 24. Referring to FIG. 4, a method S200 for making a high-resolution camera module according to an embodiment of the present invention includes the steps of: providing an image sensor wafer (step S210), performing inspection to define good chips (step S220), disposing an optical cover onto each good chip (step S230), cutting the image sensor wafer (step S240), disposing each image sensor chip onto a ceramic substrate (step S250), and forming a packaging portion (step S260).

Figure 5:
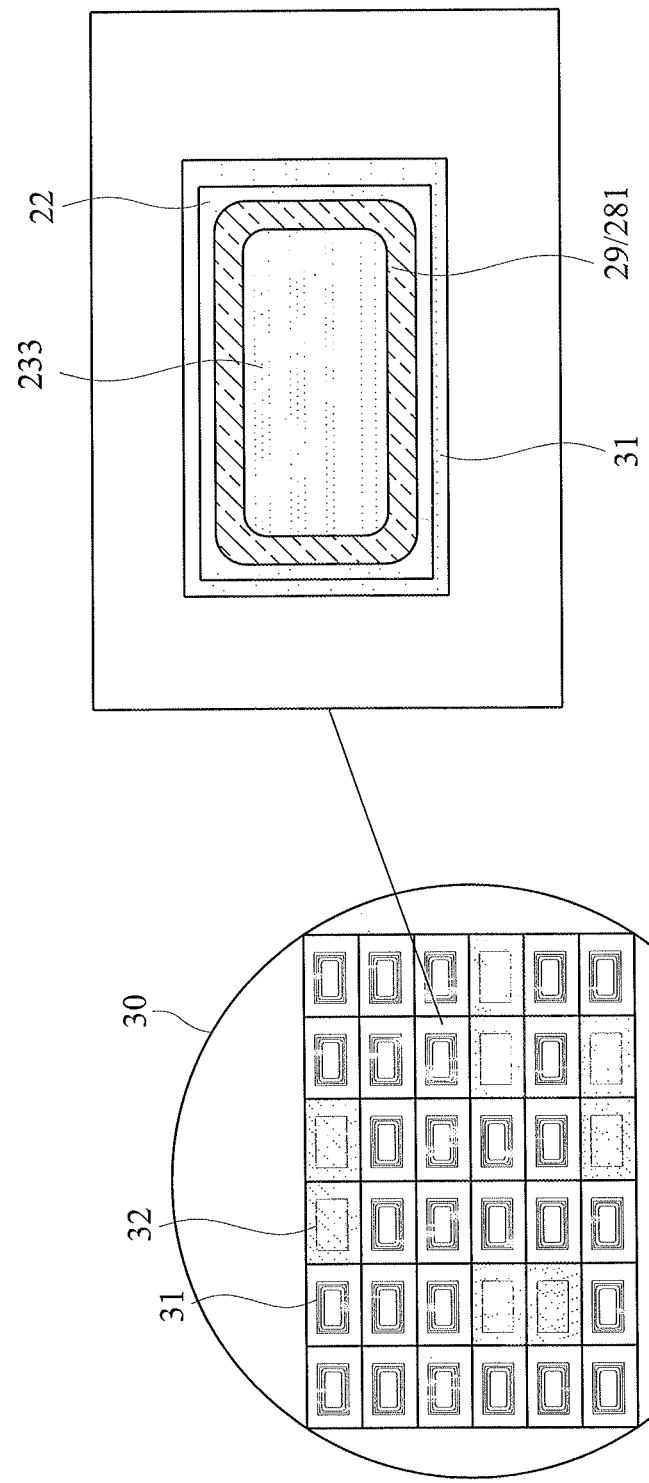
FIG. 5 is a top view and a partial enlarged view for a wafer of a high-resolution camera module according to an embodiment of the present invention.

The step of providing an image sensor wafer (step S210) is now described with reference to FIG. 5. An image sensor wafer 30 is made by a wafer manufacturing process and includes a plurality of wafer-level image sensor chips 23. Each image sensor chip 23 has a first surface 231 and a second surface 232, wherein the first surface 231 is an upper surface of the image sensor chip 23 and has a sensing area 233 surrounded by conductive contacts 26. The conductive contacts 26 may be bond pads.

The step of performing inspection to define good chips (step S220) is carried out as follows. All the finished image sensor chips 23 on the image sensor wafer 30 are inspected, by an image test or an electrical test for example, to determine whether each image sensor chip 23 functions properly and is defect-free. Additionally, a particle inspection is performed to determine if any image sensor chip 23 is rendered defective by an excessive amount of particles lying thereon. Those image sensor chips 23 which function properly and are free of defects are defined as good chips 31, and those image sensor chips 23 which fail to function properly or are defective are defined as bad chips 32.

Next, the step of disposing an optical cover onto each good chip (step S230) is executed. An optical cover 22 is provided onto the first surface 231 of each of the good chips 31 to keep the good chips 31 from particle contamination during the following packaging process (e.g., cutting process or connecting process).

In the following steps, only the good chips 31 are used, and the bad chips 32 are not used; therefore, all the image sensor chips 23 hereinafter mentioned are good chips 31. Please note that the optical covers 22 must be smaller than the good chips 31 and must not cover the conductive contacts 26 of the good chips 31. Moreover, each optical cover 22 must be located right above the sensing area 233. The optical cover 22 may be a glass cover allowing light to impinge on the sensing area 233 through the glass cover.

To prevent the optical cover 22 from tilting while being disposed on the image sensor chip 23, the step of disposing an optical cover (step S230) can be performed with the following two ways: the first one is epoxy dispensing and the second one is dam forming.

Figure 6:
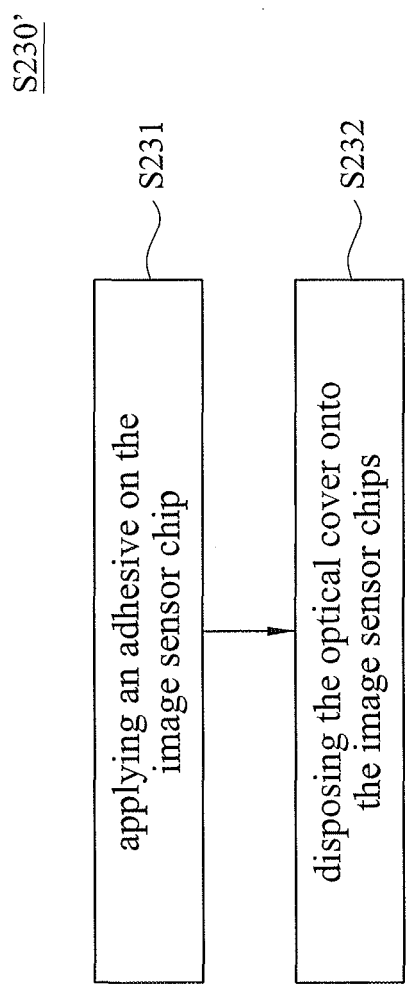
FIG. 6 is a flowchart of an epoxy dispensing method for disposing an optical cover according to an embodiment of the present invention.
Figure 7A:
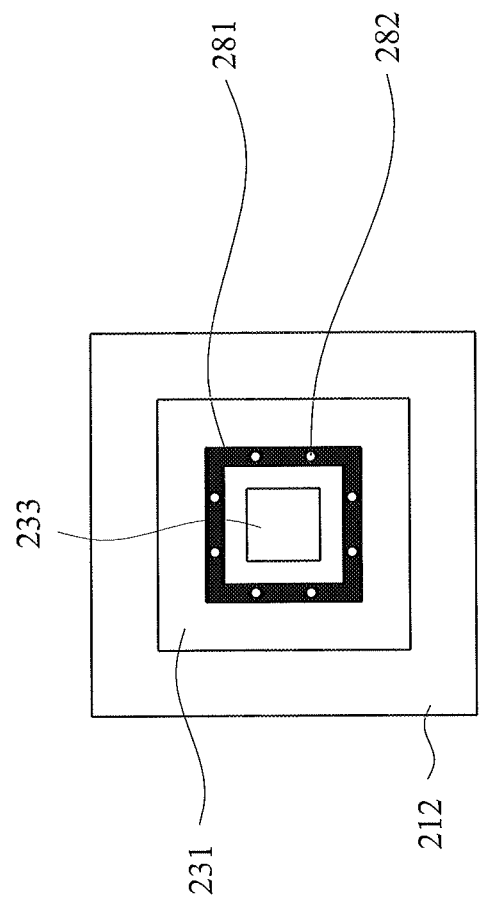
FIG. 7A is a top view of region AA' in FIG. 3 according to an embodiment of the present invention.

Referring to FIGS. 3, 6, and 7A, in the epoxy dispensing method, the step of disposing an optical cover (step S230') includes: applying an adhesive on the image sensor chip (step S231) and disposing the optical cover onto the image sensor chip (step S232).

To begin with, in step S231, an adhesive 281 is applied, by an epoxy dispensing technique, to the first surface 231 of the image sensor chip 23 at positions approximately between the conductive contacts 26 and the sensing area 233, i.e., at positions where the optical cover 22 is to be bonded. The adhesive 281 can be applied in a closed loop pattern to form and seal a cavity 27 between the optical cover 22 and the image sensor chip 23.

Then, in step S232, the optical cover 22 is bonded to the image sensor chip 23 by the adhesive 281. The adhesive 281 may be used in conjunction with ball spacers 282. The adhesive 281 may be used in conjunction with ball spacers 282, whose height prevents the flowing adhesive 281 from forming various heights and thereby prevents the optical cover 22 from tilting. Should the optical cover 22 tilt, the yield rate will be lowered.

Figure 7B:
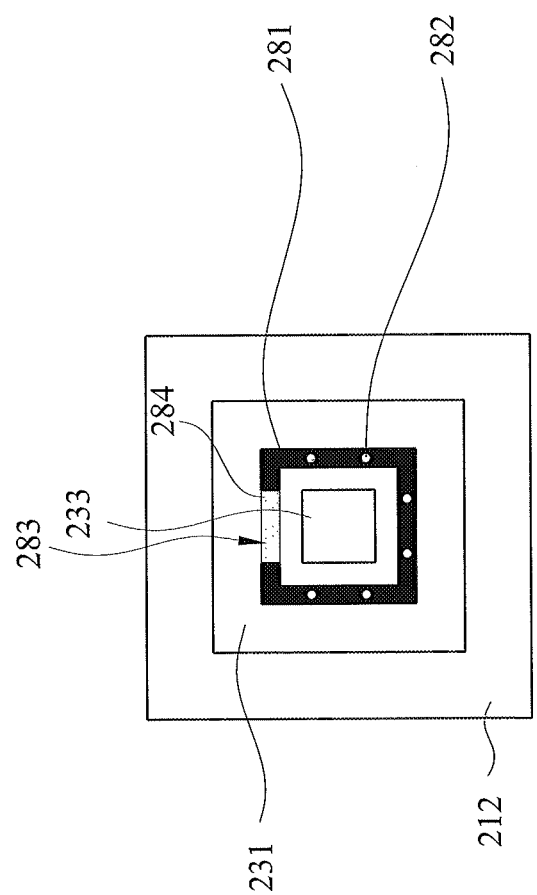
FIG. 7B is another top view of region AA' in FIG. 3 according to an embodiment of the present invention.

Referring to FIG. 7B as well, the adhesive 281 may be in a C shape pattern with an opening 283. It prevents gas pressure inside the cavity 27 from varying due to rising temperature, and thereby prevents the optical cover 22 from tilting or the adhesive 281 from overflowing.

Figure 7C:
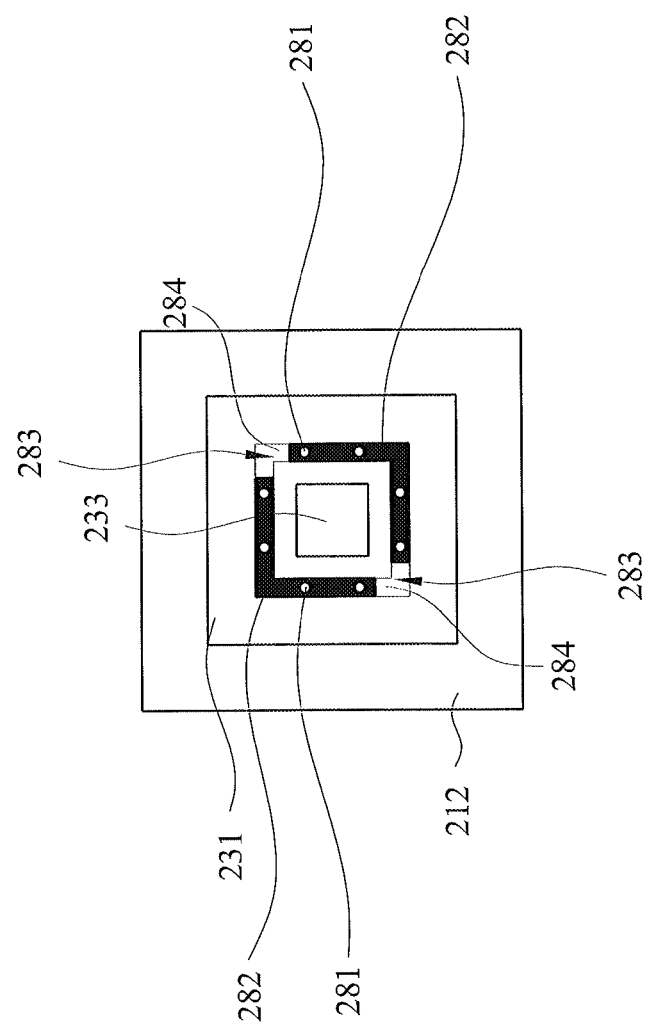
FIG. 7C is still another top view of region AA' in FIG. 3 according to an embodiment of the present invention.

Referring to FIG. 7C as well, the adhesive 281 may be in two L shape patterns. These L shape patterns may be disposed diagonally to form a square pattern with two openings 283 in two diagonal corners. The opening 283, formed among the adhesive 281, the optical cover 22 and the image sensor chip 23, may balance the gas pressure inside and outside the cavity 27 to prevent excessively high pressure inside the cavity 27 from pushing the optical cover 22 or the adhesive 281 and causing tilt of the optical cover 22 or overflow of the adhesive 281.

Figure 8:
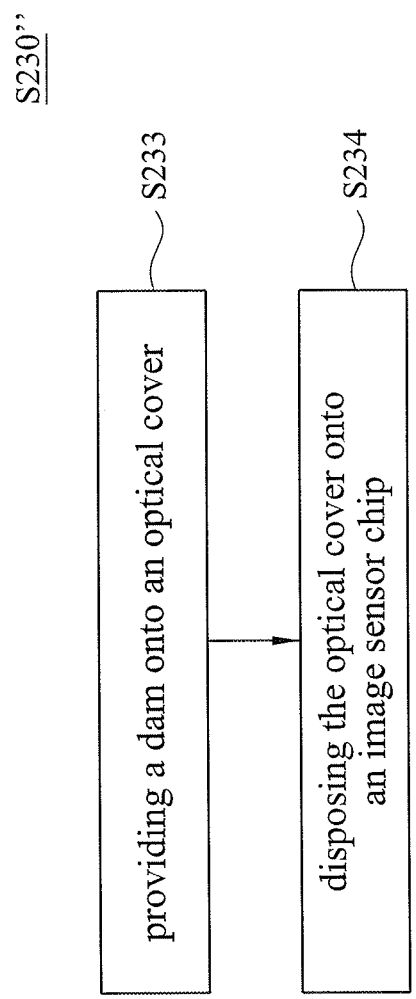
FIG. 8 is a flowchart of a dam forming method for disposing an optical cover according to an embodiment of the present invention.
Figure 9A:
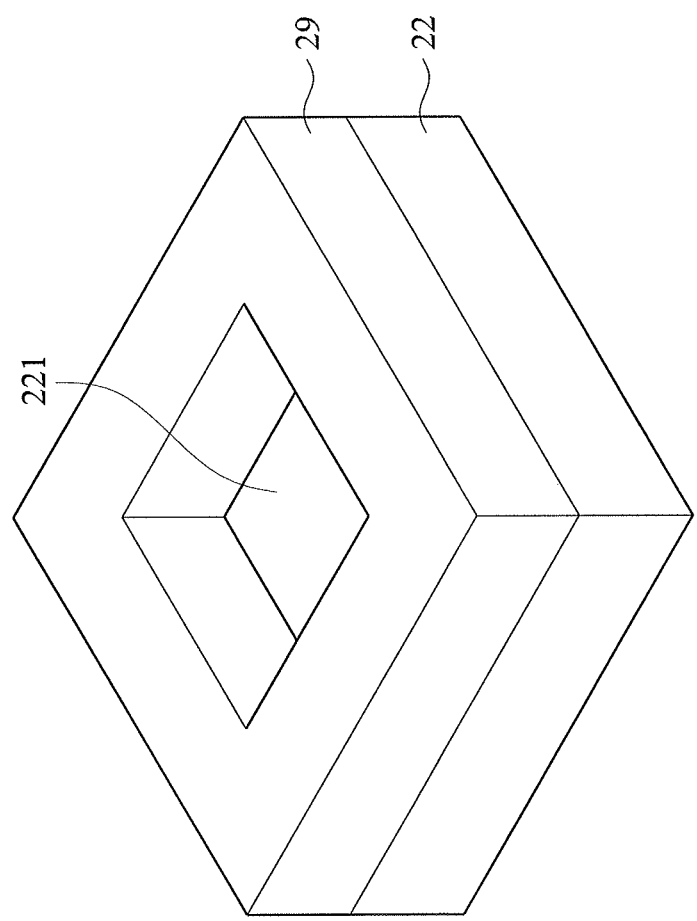
FIG. 9A is an isometric view of an optical cover combined with a dam according to an embodiment of the present invention.
Figure 9B:
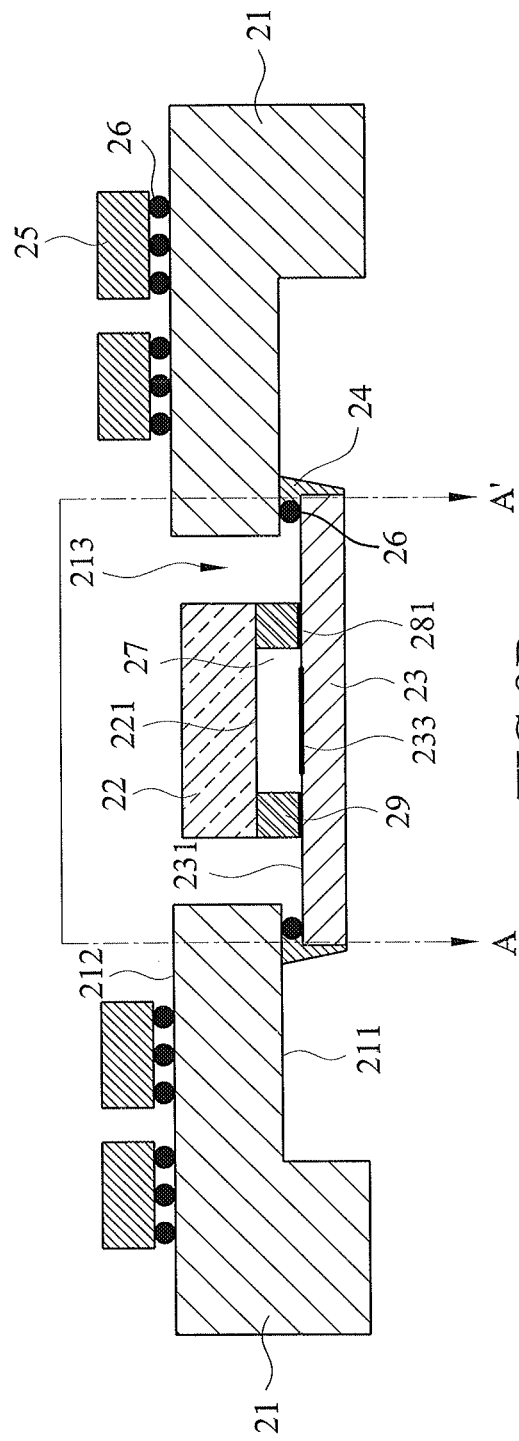
FIG. 9B is another sectional view for a structure of a high-resolution camera module according to an embodiment of the present invention.
Figure 10A:
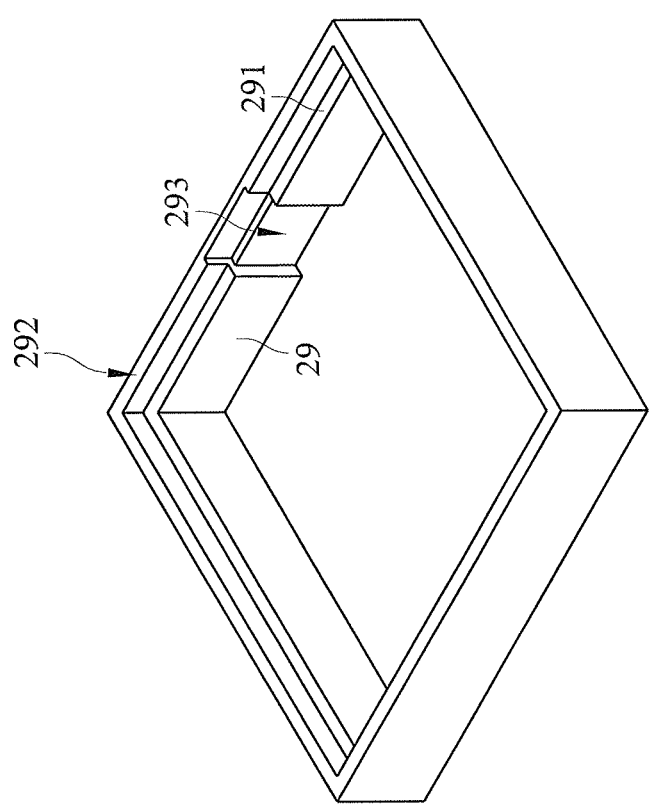
FIG. 10A is an isometric view of a dam according to an embodiment of the present invention.
Figure 10B:
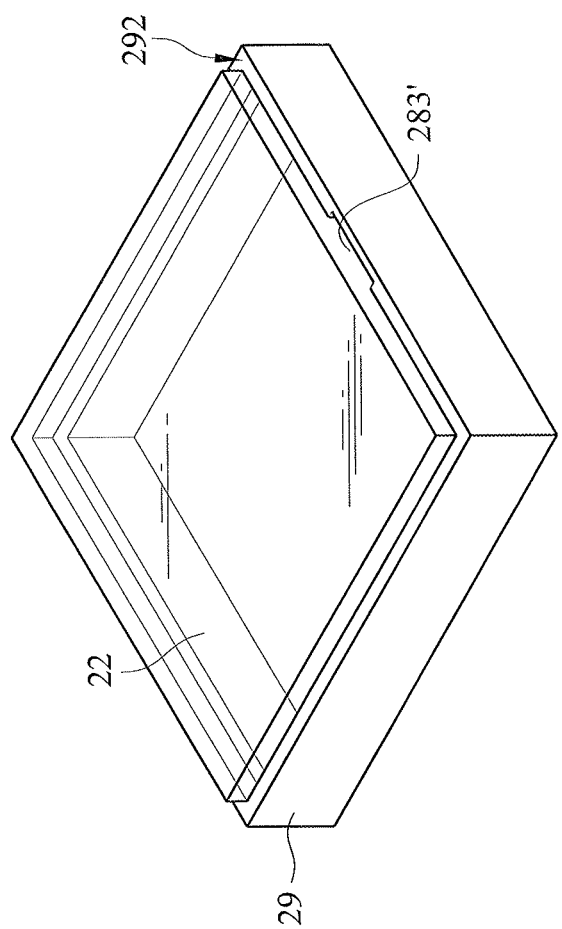
FIG. 10B is another isometric view of an optical cover combined with a dam according to an embodiment of the present invention.
Figure 10C:
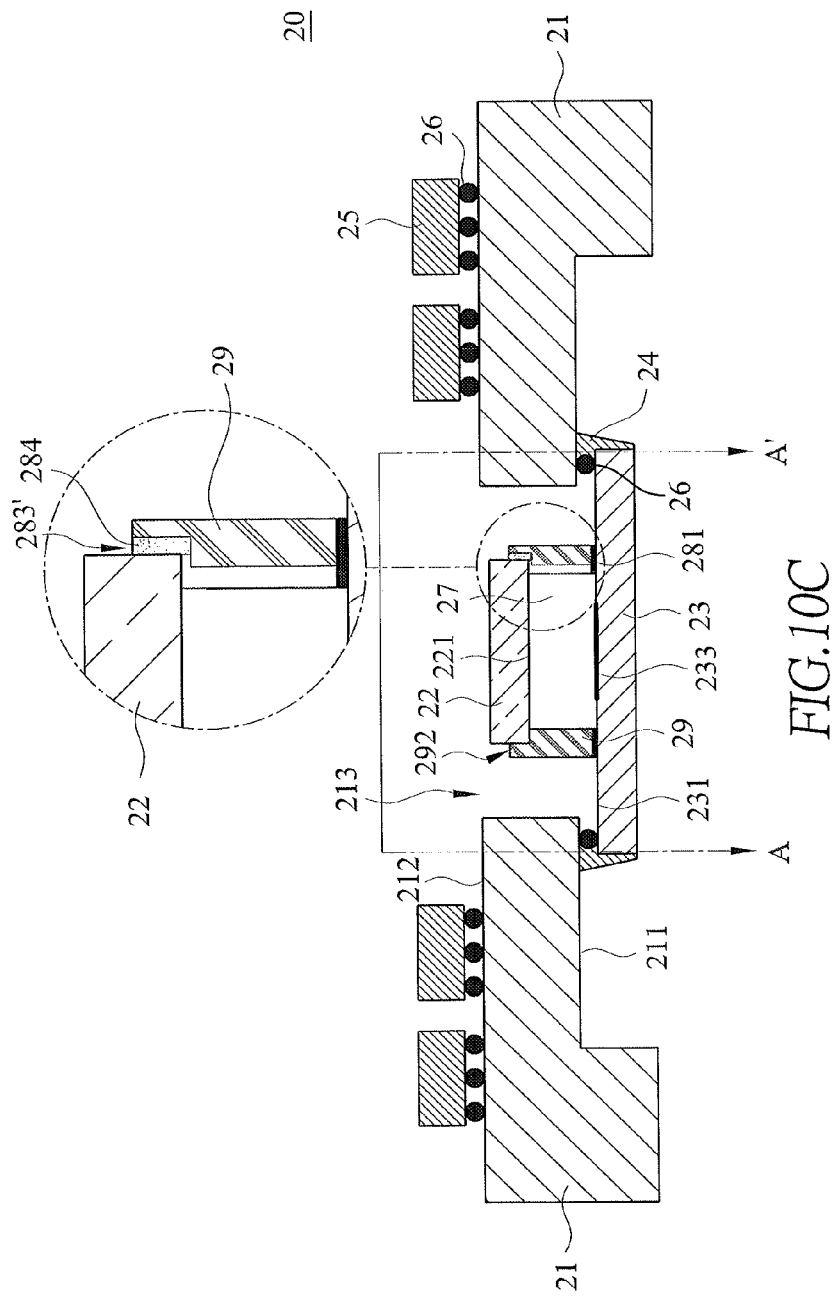
FIG. 10C is still another sectional view for a structure of a high-resolution camera module according to an embodiment of the present invention.
Figure 10D:
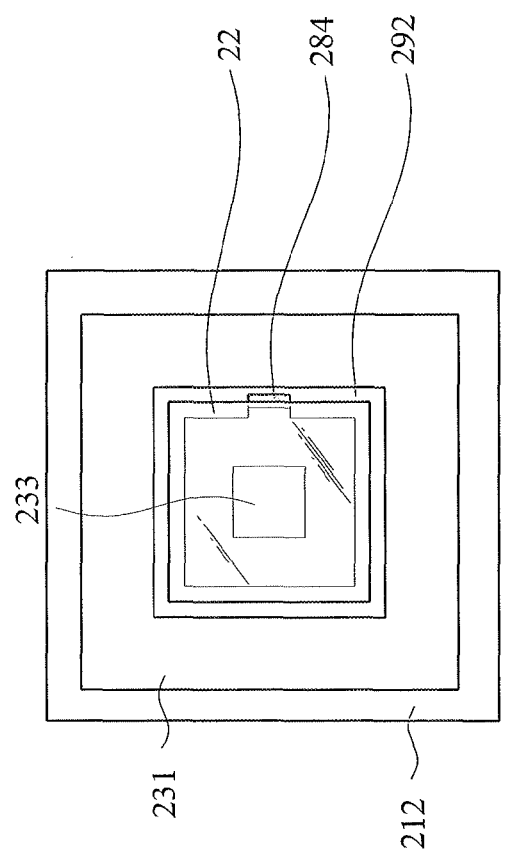
FIG. 10D is a top view of region AA' in FIG. 10C according to an embodiment of the present invention.

As shown in FIG. 8 to FIG. 9B, in the method of dam forming, the step of disposing an optical cover (step S230") includes: providing a dam onto an optical cover (step S233) and disposing the optical cover onto an image sensor chip (step S234).

First, in step S233, a dam 29 is provided on a periphery of a third surface 221, which faces the image sensor chip 23, of an optical cover 22. The dam 29 may be a closed loop structure which flushes with sides of the third surface 211 or is located on the interior of the third surface 211 and keeps a distance from the sides of the third surface 211.

In step S234 that follows, the adhesive 281 is pre-applied to the first surface 231 of the image sensor chip 23 at positions approximately between the conductive contacts 26 and the sensing area 233. The optical cover 22 on which the dam 29 has been formed is bonded to the image sensor chip 23 by adhering a bottom surface of the dam 29 with the adhesive 281 such that the optical cover 22 lies above the image sensor chip 23. The adhesive 281 is also in a closed loop pattern to form and completely seal a cavity 27 among the optical cover 22, the dam 29 and the image sensor chip 23.

A fixed height of the dam 29 ensures that the optical cover 22 is parallel to the image sensor chip 23 without tilting. Furthermore, a volume of the cavity 27 can be effectively reduced by controlling the fixed height of the dam 29. The dam 29 can be made of any one of the following or a combination thereof: epoxy, silicone, liquid crystal polymer, molding compound, siloxane based polymer, photosensitive dry film, solder mask, glass, and ceramic.

As shown in FIG. 10A to FIG. 10D, to solve unsteady bonding of the optical cover 22 or overflow of the adhesive due to excessively high air pressure inside the cavity 27 under temperature variation during process, a depression 293 may be formed on an inside of the dam 29. Because of the depression, a lower plane is formed inside an upper surface 291 of the dam 29 on the depression 293, and stepwise level differences are formed longitudinally and transversely. A frame flange 292 may be formed on an outer peripheral edge of the upper surface 291 of the dam 29, and a thickness for a portion of the frame flange 292 corresponding to the depression 293 may be smaller.

When the frame flange 292 is combined with the optical cover 22, a periphery of a lower surface of the optical cover 22 may be disposed on the interior of the upper surface 291 of the dam 29, and the lateral side of the optical cover 22 connects the frame flange 292. However, the lower plane on the depression 293 cannot contact the optical cover 22, and the thickness for the portion of the frame flange 292 corresponding to the depression 293 is smaller, it cannot tightly contact the periphery of the optical cover 22. An opening 283' with L shaped section is formed where the optical cover 22, the frame flange 292, and the dam 29 do not contact with each other. The opening 283' may be used to circulate gas inside and outside the cavity 27 to balance gas pressure.

As shown in the FIGS. 4, 7B, 7C and 10C, if openings 283/283' are used to balance gas pressure inside and outside the cavity 27, the method S200 may further include an opening sealing step S235 for sealing the openings 283/283' with a sealant 284 after completion of the step S230. Thus, the high-resolution camera module 20 further includes a sealant 284 air-tightly filling the openings 283/283' to prevent contamination or damage to the image sensor chip 23 during early stage of the manufacturing process and increase yield rate.

As shown in FIGS. 4, 5, 9B and 10C, in the step of cutting the image sensor wafer (step S240), at last, the image sensor wafer 30 is cut to obtain the discrete image sensor chip 23 covered with the optical cover 22 respectively.

As shown in the FIGS. 3 to 5, 9B and 10C, in the step of disposing the image sensor chip onto a ceramic substrate (step S250), the divided image sensor chip 23 is then electrically connected to a ceramic substrate 21 by a flip-chip technique. The ceramic substrate 21 has a hollow portion 213, a bottom surface 211, and a top surface 212, wherein the top surface 212 is an upper surface of the ceramic substrate 21 and the bottom surface 211 is a lower surface of the ceramic substrate 21. A horizontal area of the hollow portion 213 is larger than the surface of the optical cover 22 such that the optical cover 22 can be accommodated in a space formed by the hollow portion 213 when the optical cover 22 is covered on the image sensor chip 23. The first surface 231 of the divided image sensor chip 23 is adhered and disposed to the bottom surface 211 of the ceramic substrate 21 and faces the hollow portion 213 such that the image sensor chip 23 is electrically connected to a circuit structure on the bottom surface 211 of the ceramic substrate 21 through conductive contacts 26.

In the step of forming a packaging portion (step S260), a mold compound or a liquid compound is used to fill a periphery of the image sensor chip 23 and connection between the image sensor chip 23 and the ceramic substrate 21 to form a packaging portion 24. Thus, the packaging portion 24 covers the periphery of the image sensor chip 23 and the connection between the image sensor chip 23 and the ceramic substrate 21 to improve protection for the periphery of the image sensor chip 23 and prevent it from collision damages.

The high-resolution camera module 20 may further include a plurality of passive elements 25 disposed on the top surface 212 of the ceramic substrate 21. The passive elements 25 may be electrically connected to the image sensor chip 23 through the conductive contacts 26.

The disclosed method S200 for making a high-resolution camera module and the high-resolution camera modules 20 made thereby feature a relatively small cavity 27, which not only reduces the volume of the high-resolution camera modules 20, but also increases temperature cycling reliability. By disposing the optical covers 22 respectively onto only the good chips 31 which have been inspected in advance, a wasteful use of materials is avoided, and the yield rate can be improved. Moreover, as the optical covers 22 are respectively disposed on the image sensor chips 23 on the image sensor wafer 30 before the image sensor wafer 30 is cut, the image sensor chips 23 are protected from the very beginning to avoid contamination, allowing the yield rate and production efficiency of the high-resolution camera modules to be increased.

The features of the present invention are disclosed above by the preferred embodiment to allow persons skilled in the art to gain insight into the contents of the present invention and implement the present invention accordingly. The preferred embodiment of the present invention should not be interpreted as restrictive of the scope of the present invention. Hence, all equivalent modifications or amendments made to the aforesaid embodiment should fall within the scope of the appended claims.

What is claimed is:

1. A method for making a high-resolution camera module comprising the steps of:

provide an image sensor wafer, wherein the image sensor wafer comprises a plurality of image sensor chips, each image sensor chip includes a first surface, a second surface, and a plurality of conductive contacts, wherein the first surface has a sensing area surrounded by the plurality of conductive contacts;

performing an inspection to inspect and define if each image sensor chip is a good chip;

disposing an optical cover on the first surface of the image sensor chip defined as the good chip, wherein the optical cover faces the sensing area and does not cover the conductive contacts, and the surface of the optical cover is smaller than the surface of the image sensor chip;

cutting the image sensor wafer to obtain the discrete image sensor chip covered with the optical cover;

disposing the image sensor chip on a ceramic substrate, wherein the ceramic substrate has a hollow portion, a bottom surface, and a top surface, a horizontal area of the hollow portion is larger than the surface of the optical cover, the first surface of the divided image sensor chip is adhered and disposed to the bottom surface and faces the hollow portion, and the conductive contacts of the image sensor chip are electrically connected to the ceramic substrate; and forming a packaging portion to cover a periphery of the image sensor chip and connection between the image sensor chip and the ceramic substrate.

2. The method of claim 1, wherein the step of disposing the optical cover comprises: a substep of applying an adhesive on the image sensor chip, wherein the adhesive is applied on the first surface and on a region between the sensing area and the conductive contacts; and a substep of disposing the optical cover onto the image sensor chip for bonding the optical cover on the image sensor chip with the adhesive.

3. The method of claim 2, wherein the adhesive is further mixed with ball spacers.

4. The method of claim 2, wherein the adhesive shows a closed loop pattern.

5. The method of claim 1, wherein the step of disposing the optical cover comprises: a substep of providing a dam on the optical cover, wherein the dam is a closed loop structure and provided on a periphery of a third surface of the optical cover, and the third surface faces the image sensor chip; and a substep of disposing the optical cover on the image sensor chip, wherein an adhesive is pre-applied on the first surface between the sensing area and the conductive contacts in a closed loop pattern, and the optical cover is bonded to the image sensor chip by the adhesive.

6. The method of claim 5, wherein the dam is made of glass, ceramic, liquid crystal polymer, molding compound, siloxane based polymer, photosensitive dry film, or solder mask.

7. The method of claim 5, wherein a frame flange is formed on an outer peripheral edge of an upper surface of the dam and combined with lateral side of the optical cover, a depression is formed on an inside of the dam, and an opening is formed between the optical cover and the frame flange; and the method further comprises a step of sealing the opening for sealing the opening with a sealant.

8. The method of claim 7, wherein the dam is made of glass, ceramic, liquid crystal polymer, molding compound, siloxane based polymer, photosensitive dry film, or solder mask.

9. The method of claim 2, wherein the adhesive shows a C shape pattern with an opening; and the method further comprises a step of sealing the opening for sealing the opening with a sealant.

10. The method of claim 2, wherein the adhesive shows two L shape patterns, and the L shape patterns are disposed correspondingly to form a square pattern with two openings in two diagonal corners; and the method further comprises a step of sealing the opening for sealing the opening with a sealant.

* * * * *